(12) United States Patent
Ying et al.

(10) Patent No.: US 11,818,857 B2
(45) Date of Patent: Nov. 14, 2023

(54) HARD DISK SUPPORTING STRUCTURE

(71) Applicants: Inventec (Pudong) Technology Corporation, Shanghai (CN); INVENTEC CORPORATION, Taipei (TW)

(72) Inventors: Yang Ying, Shanghai (CN); Xuefeng Chen, Shanghai (CN); Yanhua Shi, Shanghai (CN); Lisheng Wang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/704,034

(22) Filed: Mar. 25, 2022

(65) Prior Publication Data

US 2023/0072341 A1 Mar. 9, 2023

(30) Foreign Application Priority Data

Sep. 3, 2021 (CN) .......................... 202111029862.3

(51) Int. Cl.
*H05K 7/14* (2006.01)
*G11B 33/12* (2006.01)

(52) U.S. Cl.
CPC .......... *H05K 7/1411* (2013.01); *G11B 33/125* (2013.01)

(58) Field of Classification Search
CPC ............................ G11B 33/125; H05K 7/1411
See application file for complete search history.

(56) References Cited

U.S. PATENT DOCUMENTS

| 3,028,209 A | * | 4/1962 | Hinkel | A47B 88/457 |
| | | | | 312/247 |
| 6,333,829 B1 | * | 12/2001 | Jones | G11B 15/6875 |
| | | | | 360/92.1 |
| 7,583,507 B2 | * | 9/2009 | Starr | G11B 33/126 |
| | | | | 361/725 |
| 8,744,621 B2 | * | 6/2014 | Michael | A47B 88/90 |
| | | | | 221/133 |

* cited by examiner

*Primary Examiner* — James Wu

(57) ABSTRACT

A hard disk supporting structure is provided. The hard disk supporting structure includes a hard disk rack, a crawler mechanism, and a motor. The hard disk rack is for disposing at least one hard disk. A crawler of the crawler mechanism is fixedly connected with the hard disk rack. The motor is connected to a driving gear of the crawler mechanism. The motor drives the rotation of the driving gear, to enable the crawler to drive the hard disk rack to move back and forth. The hard disk supporting structure can automatically move the hard disk rack back and forth through a structure with automatic telescopic function, which greatly saves labor, and improves efficiency.

6 Claims, 2 Drawing Sheets

HARD DISK SUPPORTING STRUCTURE

CROSS REFERENCE TO RELATED APPLICATION

This application claims the benefits of priority to Chinese Patent Application No. CN 2021110298623, entitled "Hard Disk Supporting Structure", filed with CNIPA on Sep. 3, 2021, the content of which is incorporated herein by reference in its entirety.

FIELD OF TECHNOLOGY

The present disclosure relates to the field of hard disks, and more specifically, to a hard disk supporting structure.

BACKGROUND

A hard disk rack is a structure for supporting hard disks. The hard disk rack may integrate multiple hard disks together for large-scale data storage. A conventional drawer hard disk rack needs to be pulled in or out manually. When the hard disk rack is long, this pull-in or pull-out operation requires more physical strength and time of the operator, thereby resulting in low work efficiency.

SUMMARY

The present disclosure provides a hard disk supporting structure, comprising: a hard disk rack, for disposing at least one hard disk; a crawler mechanism, wherein a crawler of the crawler mechanism is fixedly connected to the hard disk rack; and a motor, connected to a driving gear of the crawler mechanism; wherein the motor drives the driving gear to rotate, to enable the crawler to drive the hard disk rack to move back and forth.

In an embodiment of the present disclosure, the hard disk supporting structure further comprises: a platform, wherein both the crawler mechanism and the motor are fixedly disposed on the platform; wherein the hard disk rack moves back and forth on the platform.

In an embodiment of the present disclosure, the hard disk supporting structure further comprises: a shell, covered on the platform, wherein a holding space is formed between the shell and the platform; the holding space is for accommodating the hard disk rack.

In an embodiment of the present disclosure, an inner wall of the shell is slidably connected to an outer side wall of the hard disk rack through a sliding rail.

In an embodiment of the present disclosure, the hard disk supporting structure further comprises: a control button, disposed on a front outer wall of the hard disk rack; wherein the control button is electrically connected to the motor, and, by controlling the motor, controls the hard disk rack to move forward, to move backward, or stop moving.

In an embodiment of the present disclosure, the hard disk supporting structure further comprises: a winding slot, disposed on the platform of the hard disk supporting structure, for accommodating a connecting wire between the control button and the motor.

In an embodiment of the present disclosure, the winding slot comprises a crawler-type slot protruding from the platform; wherein the crawler-type slot is located below the crawler mechanism.

In an embodiment of the present disclosure, the crawler is fixedly connected to the hard disk rack through a fixing block.

In an embodiment of the present disclosure, a middle portion of the hard disk rack is provided with a slot portion matching the shape of the crawler mechanism; wherein the crawler mechanism is located in the slot portion, and two terminals of the fixing block are respectively fixed on two sides of the slot portion.

In an embodiment of the present disclosure, the driving gear is fixed to an output shaft of the motor.

As described above, the hard disk supporting structure in the present disclosure drives the hard disk rack to move back and forth by controlling the forward or reverse rotation of the crawler, thereby automating the movement of the hard disk rack, reducing labor cost, and increasing efficiency.

REFERENCE NUMERALS

Figure 1:
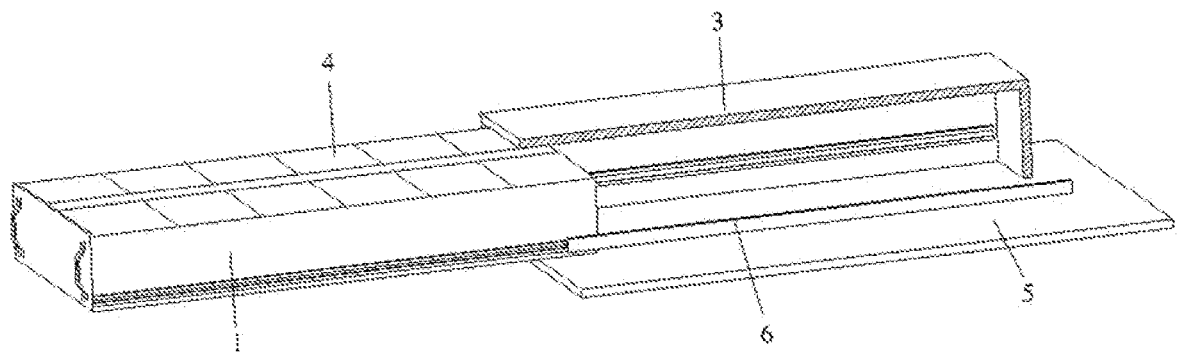
FIG. 1 is a schematic diagram of a hard disk supporting structure in the prior art.

1 Hard disk rack
2 Control button
3 Shell
4 Hard disk
5 Platform
6 Sliding rail
10 Driven gear
11 Driving gear
12 Motor
13 Crawler-type slot
14 Crawler
15 Fixing block
L Crawler mechanism

DETAILED DESCRIPTION

The embodiments of the present disclosure will be described below through specific examples. One skilled in the art can easily understand other advantages and effects of the present disclosure according to contents disclosed in the description. The present disclosure may also be implemented or applied through other different embodiments, and various modifications or changes may be made to all details in the description based on different points of view and applications without departing from the spirit of the present disclosure It needs to be stated that the drawings provided in these embodiments are just used for schematically describing the basic concept of the present disclosure, thus only illustrate components only related to the present disclosure and are not drawn according to the numbers, shapes and sizes of components during actual implementation, the configuration, number and scale of each component during actual implementation thereof may be freely changed, and the component layout configuration thereof may be more complex As shown in FIG. 1, a conventional drawer hard disk rack 1 is provided. The drawer hard disk rack 1 is disposed on a platform 5, and the drawer hard disk rack 1 carries multiple hard disks 4. The drawer hard disk rack 1 is slidably connected to a shell 3 through a sliding rail 6. The conventional rawer hard disk rack 1 needs to be pulled out from the shell 3 manually or to be pulled in the shell 3 manually, which is less automated. When more and more hard disks 4 are put on the hard disk rack 1, it takes more time and labor to pull in or pull out the hard disk rack 1. When the hard disk rack 1 gets longer, this pull-in or pull-out operation also consumes more time and labor, thereby resulting in low efficiency.

In the present disclosure, a hard disk supporting structure is provided. The hard disk supporting structure, which is used to control a hard disk rack to move back and forth automatically, which reduces labor required and improves efficiency.

Figure 2:
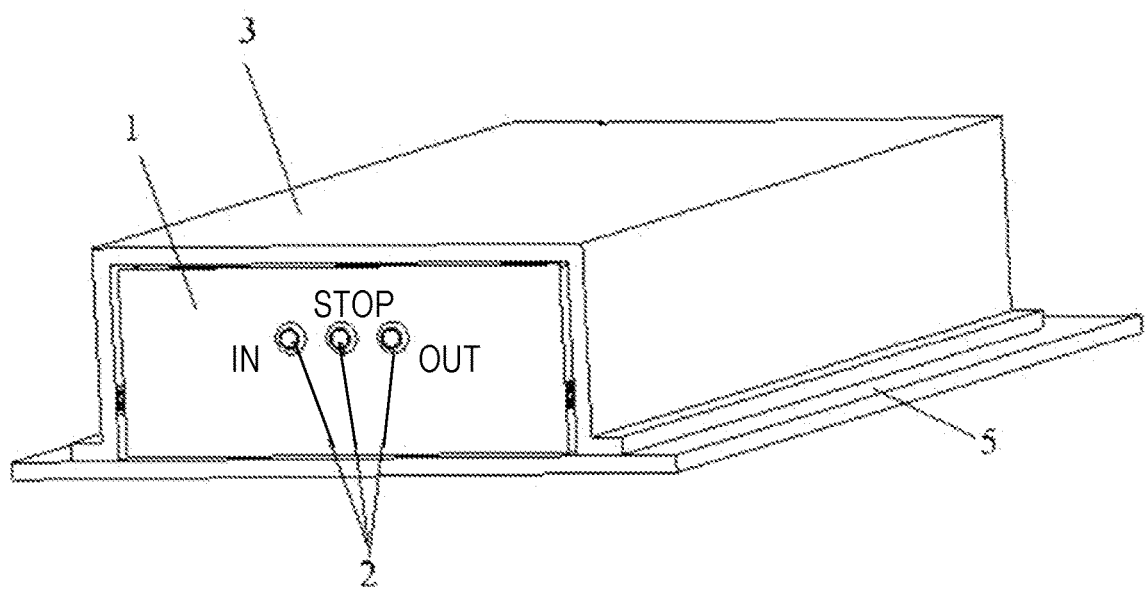
FIG. 2 is an overall schematic diagram of a hard disk supporting structure according to an embodiment of the present disclosure.

FIG. 2 is an overall schematic diagram of the hard disk supporting structure according to an embodiment of the present disclosure. FIG. 2 shows the external structure of the hard disk supporting structure. The hard disk supporting structure includes a hard disk rack 1, a control button 2, a shell 3, and a platform 5. The shell 3 is of a n-shape. The shell 3 is covered on the platform 5 and a holding space is formed between the platform 5 and the shell 3. The hard disk rack 1 is disposed in the holding space. In FIG. 2, the hard disk rack 1 is not pulled out from the shell 3 in FIG. 2. The control button 2 is disposed on the front outer wall of the hard disk rack 1. The control button 2 includes three buttons, for example, a "IN" button, an "OUT" button and a "STOP" button. When the "OUT" button is pressed by a user, the hard disk rack 1 moves forward. In the process of moving forward, if the "STOP" button is pressed, then the hard disk rack 1 stops moving immediately. In the process of moving forward, if the "IN" button is pressed, then the hard disk rack 1 moves backward. Therefore, the hard disk rack 1 does not need to be pulled in or pulled out manually. That is, the hard disk rack 1 may be pulled in or pulled out when buttons are pressed, which greatly reduces the workload.

Figure 3:
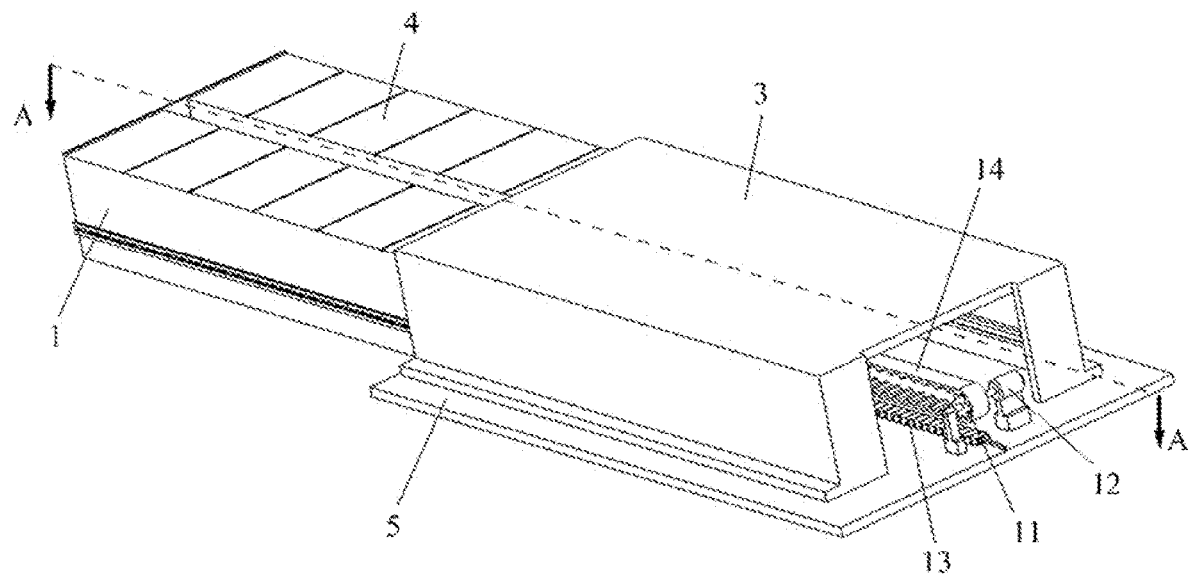
FIG. 3 is a schematic structural diagram of the hard disk supporting structure in FIG. 2 in an extended state according to an embodiment of the present disclosure.
Figure 4:
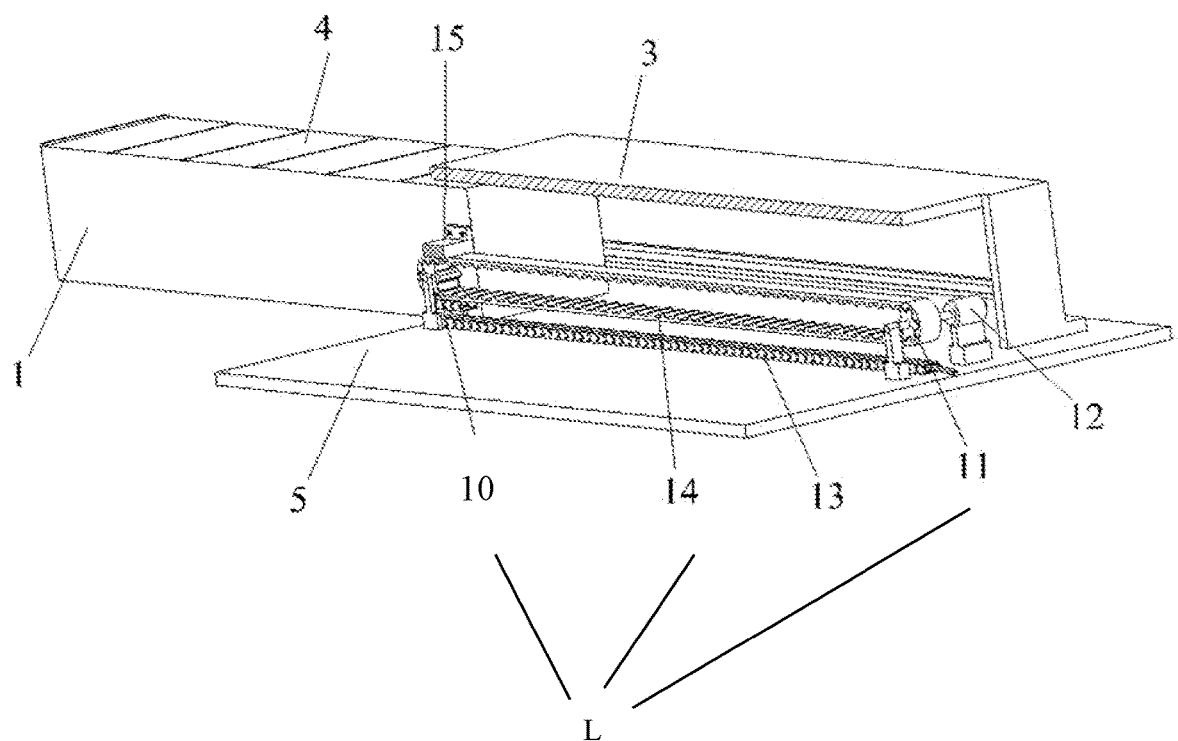
FIG. 4 is a cross-sectional view of a hard disk supporting structure, with the cutting plane passing through the line A-A shown in FIG. 3, according to an embodiment of the present disclosure.

FIG. 3 is schematic structural diagram of the hard disk supporting structure in FIG. 2 in an extended state according to an embodiment of the present disclosure. As shown in FIG. 3, the hard disk rack 1 is pulled out from the holding space. FIG. 4 is a cross-sectional view of a hard disk supporting structure, with the cutting plane passing through the line A-A shown in FIG. 3, according to an embodiment of the present disclosure. The hard disk supporting structure is described below in conjunction with FIG. 3 and FIG. 4.

As shown in FIG. 4, the hard disk supporting structure includes a hard disk rack 1, a crawler mechanism L, and a motor 12.

The hard disk rack 1 is for disposing at least one hard disk 4. Optionally, the hard disk rack 1 is divided into left and right columns by a slot portion. That is, the slot portion with a certain width is formed between the two columns. Multiple hard disks 4 are disposed in the two columns neatly.

The crawler mechanism L includes a crawler 14, a driving gear 11, and a driven gear 10. The crawler 14 is fixedly connected to the hard disk rack 1. Optionally, the crawler mechanism L is entirely located in the slot portion of the hard disk rack 1. A fixing block 15 is disposed on the crawler 14. Both ends of the fixing block 15 are fixedly connected to the left and right inner walls of the slot portion respectively. The rotation of the driving gear 11 drives the rotation of the crawler 14, and the driven gear 10 supports the crawler 14 and rotates together with the crawler 14. The rotation of the crawler 14 drives the movement of the fixing block 15, thereby driving the hard disk rack 1 to move back and forth. The motor 12 is located at the bottom of the shell 3 and is connected to the driving gear 11 of the crawler mechanism L. The motor 12 drives the driving gear 11 to rotate, to enable the crawler 14 to drive the hard disk rack 1 to move back and forth. In an embodiment, the driving gear 11 is fixed on an output shaft of the motor 12.

In addition, the control button 2 is electrically connected to the motor 12. That is, the control button 2 is connected to the motor 12 through connecting wires. Optionally, the platform 5 is provided with a winding slot. The winding slot is for accommodating the connecting wires between the control button 2 and the motor 12. In an embodiment, the winding slot is a crawler-type slot 13 protruding from the platform 5. The crawler-type slot 13 is located below the crawler mechanism L. The above structure makes full use of space and ensures that these connecting wires will not be worn.

Optionally, an inner wall (including, e.g., a left inner wall and a right inner wall) of the shell 3 is slidably connected to an outer side wall (including e.g., a left outer wall, and a right outer wall) of the hard disk rack 1 through a sliding rail 6, to ensure the stability of hard disk rack 1 in the process of moving back and forth.

The principle of controlling the forward and backward movement and stopping of the hard disk rack 1 by controlling the motor 12 will be described in detail below.

As shown in FIG. 3 or FIG. 4, the hard disk rack 1 is pulled out from the shell 3 totally. When the "IN" button is pressed, the motor 12 rotates clockwise, then the motor 12 drives the driving gear 11 to rotate clockwise, then the driving gear 11 drives the crawler 14 to rotate clockwise, then the crawler 14 drives the fixing block 15 to move backward, and finally the hard disk rack 1 is moved backward. If no buttons other than "IN" are pressed during the process of moving backward, the hard disk rack 1 will continue to move backward until it reaches a limit, that is, when, as shown in FIG. 2, the hard disk rack 1 is entirely placed in the holding space. If the "STOP" button is pressed during the above backward movement of the hard disk rack 1, the motor 12 stops rotating and the hard disk rack 1 also stops moving. If the "OUT" button is pressed during the above backward movement of the hard disk rack 1, the motor 12 rotates counterclockwise, then the motor 12 drives the driving gear 11 to rotate counterclockwise, then the driving gear 11 drives the crawler 14 to rotate counterclockwise, then the crawler 14 drives the fixing block 15 to move forward, and finally the hard disk rack 1 is moved forward. If no buttons other than "OUT" are pressed during the above process, the hard disk rack 1 will continue to move forward until it reaches a limit, that is, when, as shown in FIG. 3 or FIG. 4, the hard disk rack 1 is pulled out from the holding space completely.

As described above, the present disclosure can automatically move the hard disk rack back and forth through a structure with automatic telescopic functions, which greatly saves labor, and improves efficiency. In summary, the present disclosure effectively overcomes various defects in the prior art and has a high industrial value.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A hard disk supporting structure, comprising:
a hard disk rack, for disposing at least one hard disk;
a crawler mechanism, wherein a crawler of the crawler mechanism is fixedly connected to the hard disk rack; and
a motor, connected to a driving gear of the crawler mechanism; wherein the motor drives the driving gear to rotate, thereby enabling the crawler to drive the hard disk rack to move back and forth;
wherein the crawler is fixedly connected to the hard disk rack through a fixing block,
wherein a middle portion of the hard disk rack is provided with a slot portion matching the shape of the crawler mechanism; wherein the crawler mechanism is located in the slot portion, and two terminals of the fixing block are respectively fixed on two sides of the slot portion.

2. The hard disk supporting structure as in claim 1, further comprising:
a platform, wherein both the crawler mechanism and the motor are fixedly disposed on the platform; wherein the hard disk rack moves back and forth on the platform.

3. The hard disk supporting structure as in claim 2, further comprising:
a shell, covered on the platform, wherein a holding space is formed between the shell and the platform; the holding space is for accommodating the hard disk rack.

4. The hard disk supporting structure as in claim 3, wherein an inner wall of the shell is slidably connected to an outer side wall of the hard disk rack through a sliding rail.

5. The hard disk supporting structure as in claim 1, further comprising:
a control button, disposed on a front outer wall of the hard disk rack; wherein the control button is electrically connected to the motor, and, by controlling the motor, controls the hard disk rack to move forward, move backward, or stop moving.

6. The hard disk supporting structure as in claim 1, wherein the driving gear is fixed to an output shaft of the motor.

* * * * *